United States Patent [19]

van Tongerloo et al.

[11] 3,928,093

[45] Dec. 23, 1975

[54] METHOD FOR MAKING A BI-DIRECTIONAL SOLID STATE DEVICE

[75] Inventors: Eric Henry van Tongerloo, Minnetonka, Minn.; Abd-El-Fattah Ali Ibrahim, Ottawa, Canada; Douglas Roy Colton, Kanata, Canada; John Lawrence, Freelton, Canada

[73] Assignee: Northern Electric Company Limited, Montreal, Canada

[22] Filed: June 3, 1974

[21] Appl. No.: 475,659

[52] U.S. Cl. .................... 148/186; 148/187; 357/39

[51] Int. Cl.² ........................................ H01L 21/223

[58] Field of Search ............... 148/186, 187; 357/39

[56] References Cited

UNITED STATES PATENTS 3,183,128 5/1965 Leistiko, Jr. et al. ............... 148/186

3,312,577 4/1967 Dunster et al. ........................ 148/187

3,341,384 12/1967 Mets et al. .......................... 148/187

*Primary Examiner*—C. Lovell

*Assistant Examiner*—J. M. Davis

*Attorney, Agent, or Firm*—Sidney T. Jelly

[57] ABSTRACT

This invention is concerned with the method of making a semiconductor device having a bi-directional changeover characteristic from high impedance to low impedance at a predetermined voltage. The device is a fine layer device of essentially symmetrical form either side of a central substrate, for example N-P-N-P-N. A typical device has a central substrate layer, an outer layer on each surface of the substrate, a base region on each surface of the substrate defined by the oxide layers, an emitter region in each base region and an electrically conducting layer on each side of the substrate and in contact with related base and emitter regions. The layers, regions and other items are simultaneously produced on each side of the substrate, similar regions on each side of the substrate in alignment.

3 Claims, 21 Drawing Figures

METHOD FOR MAKING A BI-DIRECTIONAL SOLID STATE DEVICE

This invention relates to a bi-directional solid state device, in particular a switch.

Particularly, the present invention is concerned with the manufacture of a multi-layer device which has a switching action, the device altering from a high impedance to a low impedance on application of a particular bias voltage. The device as made by the process of the present invention is bi-direction, that is it can be made to conduct potentials of both positive and negative polarity.

The invention will be readily understood by the following description of a particular process, and of one example of a device produced by the method of the invention, in conjunction with the accompanying drawings, in which.

The device is a five layer structure —typically N-P-N-P-N, and is produced by a particular sequence of steps, carried out simultaneously on both sides of a substrate.

Figure 1:
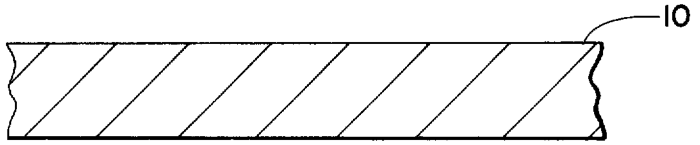
FIGS. 1 to 15 are cross-sections through a device, illustrating the various steps of the method of manufacture, together with some modifications to the method, as will be described.
Figure 2:
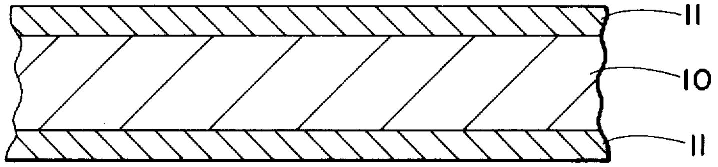
Figure 3:
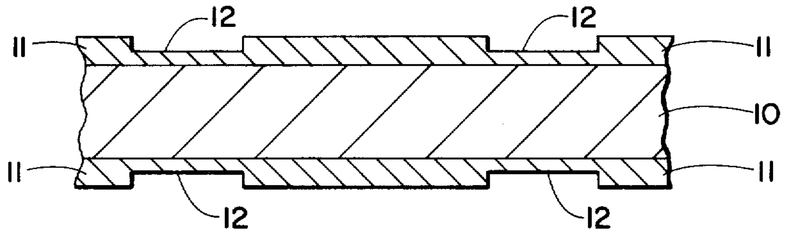
Figure 4:
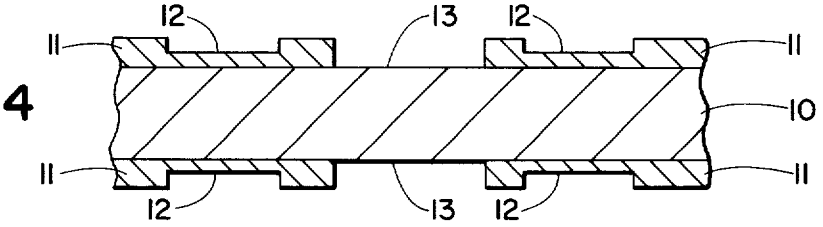
Figure 5:
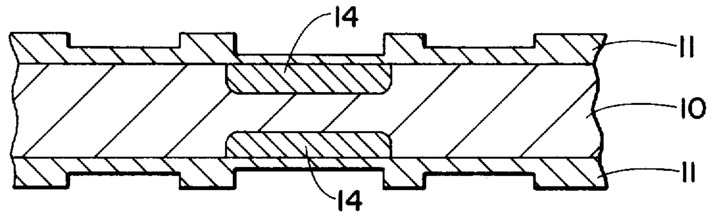

Considering FIGS. 1 to 16, the process or method commences with a precleaned substrate wafer 10, of N type silicon, having a typical resistivity of 10Ωcm and of <111> orientation. A layer of field oxide —silicon dioxide— 11 is grown on both sides of the wafer 10, in an atmosphere of burnt $H_2$ and HCl. A typical thickness of each layer 11 is 1–3μ. Then follows a first possible modification. The oxide coated wafer can either be directly photo-engraved to define bases on both sides of the wafer, or an intermediate photo-engrave step followed by a reoxidation step can be interposed to provide an optional oxide breakdown facility as will be described later. The condition of the wafer after the intermediate photo-engrave and reoxidation is illustrated in FIG. 3, the oxide breakdown occurring at 12. FIG. 4 illustrates the wafer after the photo-engraving to define base areas 13.

Figure 6:
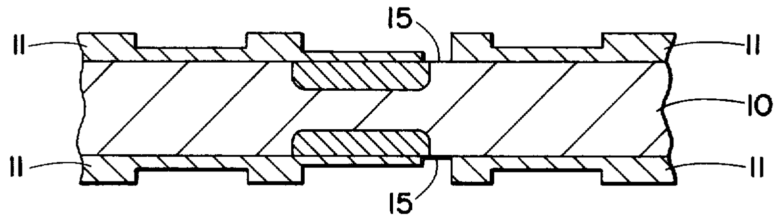
Figure 7:
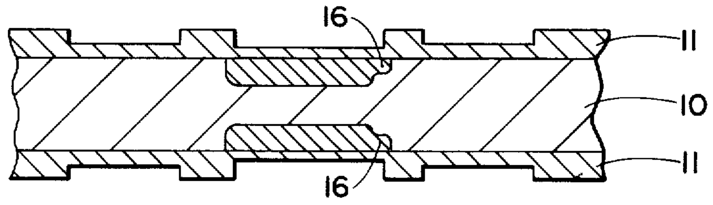

There follows a boron predeposition, at approximately 1,050°C for 40 minutes followed by boron diffusion at approximately 1,210°C for 145 minutes to form bases 14, having a resistivity of 2.45Ωcm and depth of approximately 7μm. Bases 14 will be of P+ type. Normally a photoengraving step then defines the emitter regions. However, in the event that, in a device premature microplasma breakdown becomes a problem, a further modification to the process can be applied. This is illustrated in FIG. 6, where an optional photoengraving step has defined second base areas 15, these regions being boron diffused, as for the main base regions but to a reduced depth. These secondary base regions are seen in FIG. 7 at 16.

Figure 8:
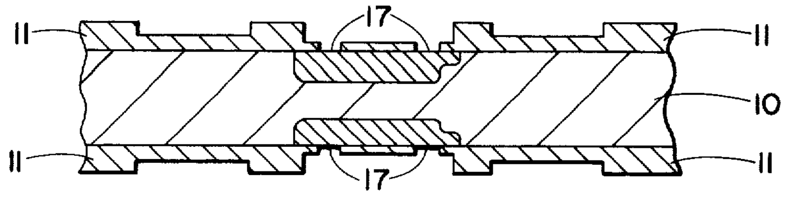
Figure 9:
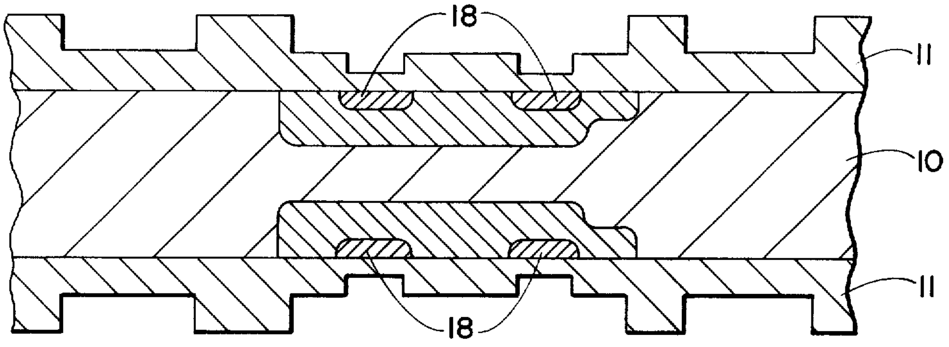

Then follows the defining of the emitter region, 17 FIG. 8, by photoengraving, followed by diffusion to form emitters 18, FIG. 9, of N+ type. The emitters 18 are formed by phosphorous deposition at 1,075°C for 8 minutes followed by diffusion at 1,075°C for 2 hours, giving a resistivity of 1.15Ωcm and a diffusion depth of approximately 2μ.

Figure 10:
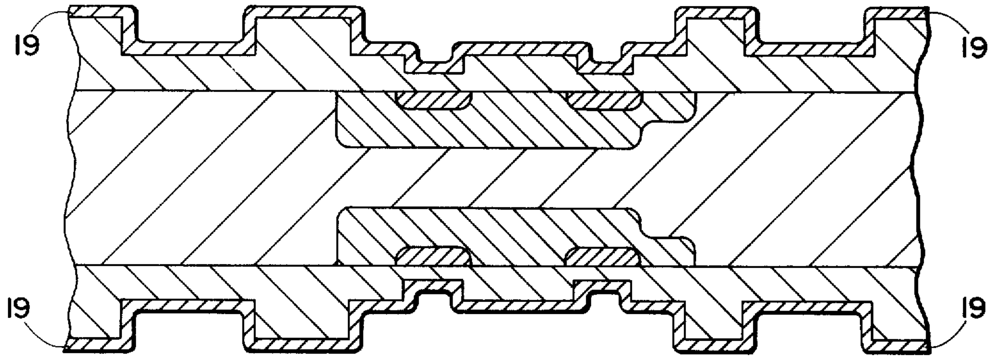
Figure 11:
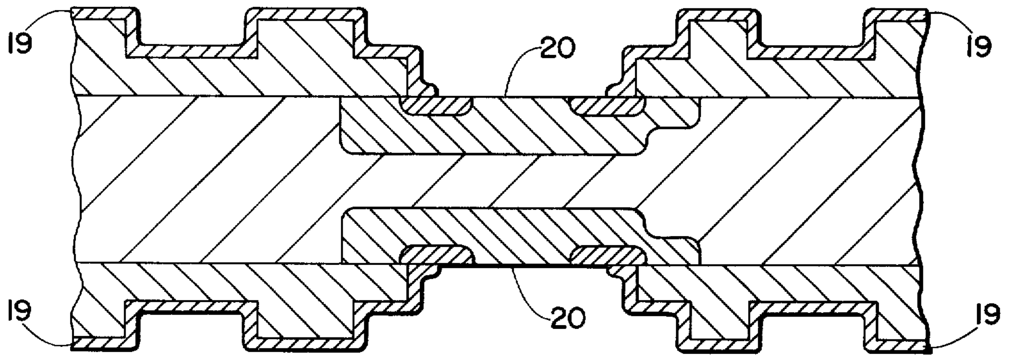
Figure 12:
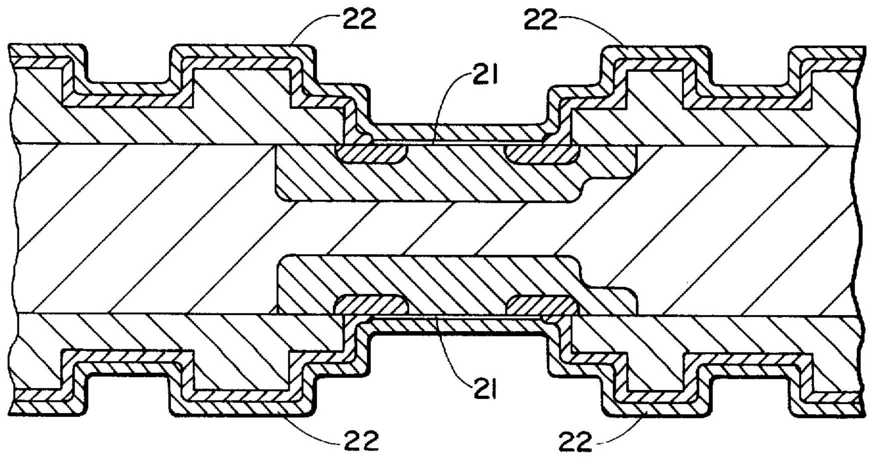

Following formation of the emitters 18, a passivation layer 19, FIG. 10, is formed. Layer 19 comprises two parts, a first layer of silicon nitride, deposited to a thickness of 1000A, followed by a second layer of pyrolytically deposited silicon dioxide of a thickness of 3000A. A further photoengraving step then follows to open contacts through the passivation layer 19. These contact areas are seen in FIG. 11 at 20.

Palladium is then deposited by filament evaporation to a thickness of 700A then sintered to form palladium silicide —at 450°C for 10 minutes in an argon atmosphere followed by masking and stripping of excess palladium in warm hydroidic acid. This forms the areas 21 in FIG. 12. Then follows a tri-metal filament evaporation of Ti/Pa/Au on both sides to form a three component layer 22 the components being respectively 1,500A, 2,000A and 1,000A thick. The substrate wafer is then as in FIG. 12.

Figure 13:
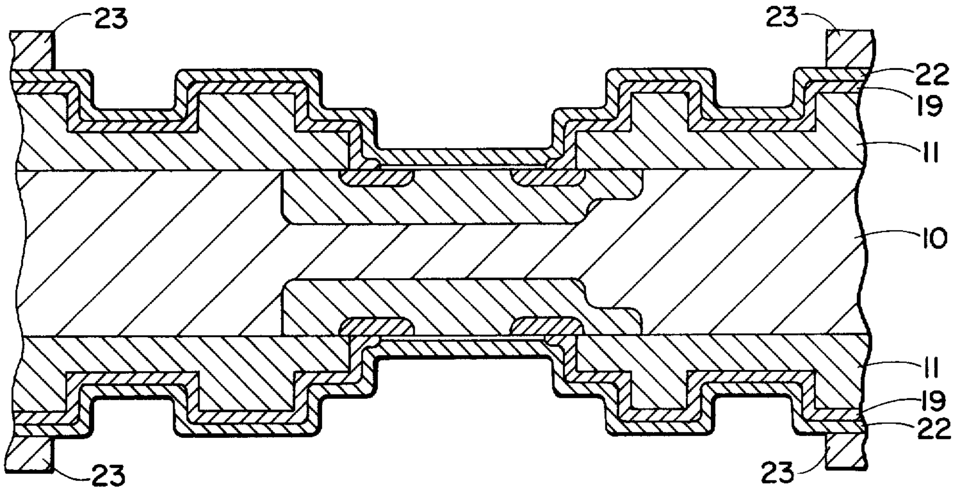

A mask 23, of photoresist, is then formed to define plating areas on both sides of the wafer, as seen in FIG. 13. The wafer is then gold plated to a thickness of between 12 to 15μ, on both sides to form layers 24, FIG. 14. The excess tri-metal layer 22 is removed and the wafer thus cleaned.

In an alternative process instead of depositing palladium followed by tri-metal evaporation, an aluminum-nickel plating can be used. Thus following formation of the passivation layer 19 and the opening of contacts through the passivation layer, that is contact areas 20 in FIG. 11, the following process steps are carried out.

An aluminum layer is deposited by filament evaporation to a depth of approximately 1 micron. This layer is then sintered for approximtely 5 minutes at a tempertaure of about 520°C. The layer is then masked and stripped to define the areas 20, FIG. 11. A thin layer of zinc is then deposited by immersion in a zincate solution. A typical zincate deposition process is as follows: immerse in 50% nitric acid for 60 seconds; mask in DI water for 2 minutes; immerse in zincate solution for 15 seconds; rinse in DI water for 2 minutes; immerse in 50% nitric acid for 60 seconds; rinse in DI water for 2 minutes; immerse in zincate solution for 28 to 30 seconds; and rinse in DI water for 2 minutes.

Following deposition, on forming, of the zinc layer the substrate is immersed in an electroless nickel plating solution for about 10 minutes. Basically an electroless nickel plating solution is composed of nickel acid fluoride, sodium hypophosphite and a pH buffering compound. Such solutions are well known and a typical one is that supplied by Shepley under the number NL63 concentrate 0.30ml of this concentrate to 1,000ml of DI water forms a suitable solution. After formation of the nickel layer the substrate is rinsed in DI water for 2 minutes.

Figure 14:
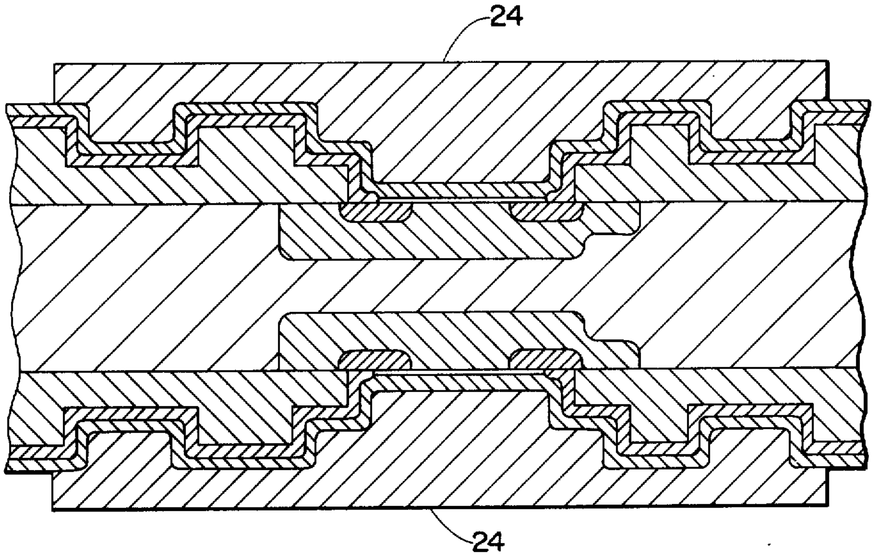
Figure 15:
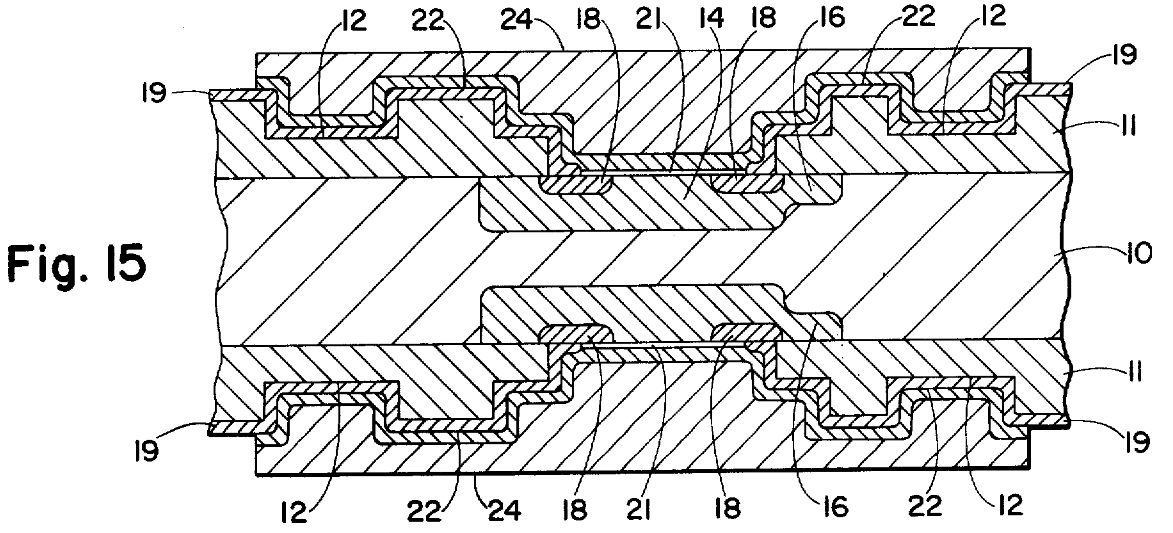

The substrate is then gold plated to a thickness of between 12 to 15μ on both sides to form layer 24, FIG. 14.

In this alternative process, once the sintered aluminum layer has been formed on each side of the wafer or substrate, and masked and stripped to define the areas 20, the succeeding layers, i.e. zinc, nickel and gold only, form on the areas defined by aluminum areas. Further masking and stripping of the succeeding layers is not required.

Figures 16, 17:
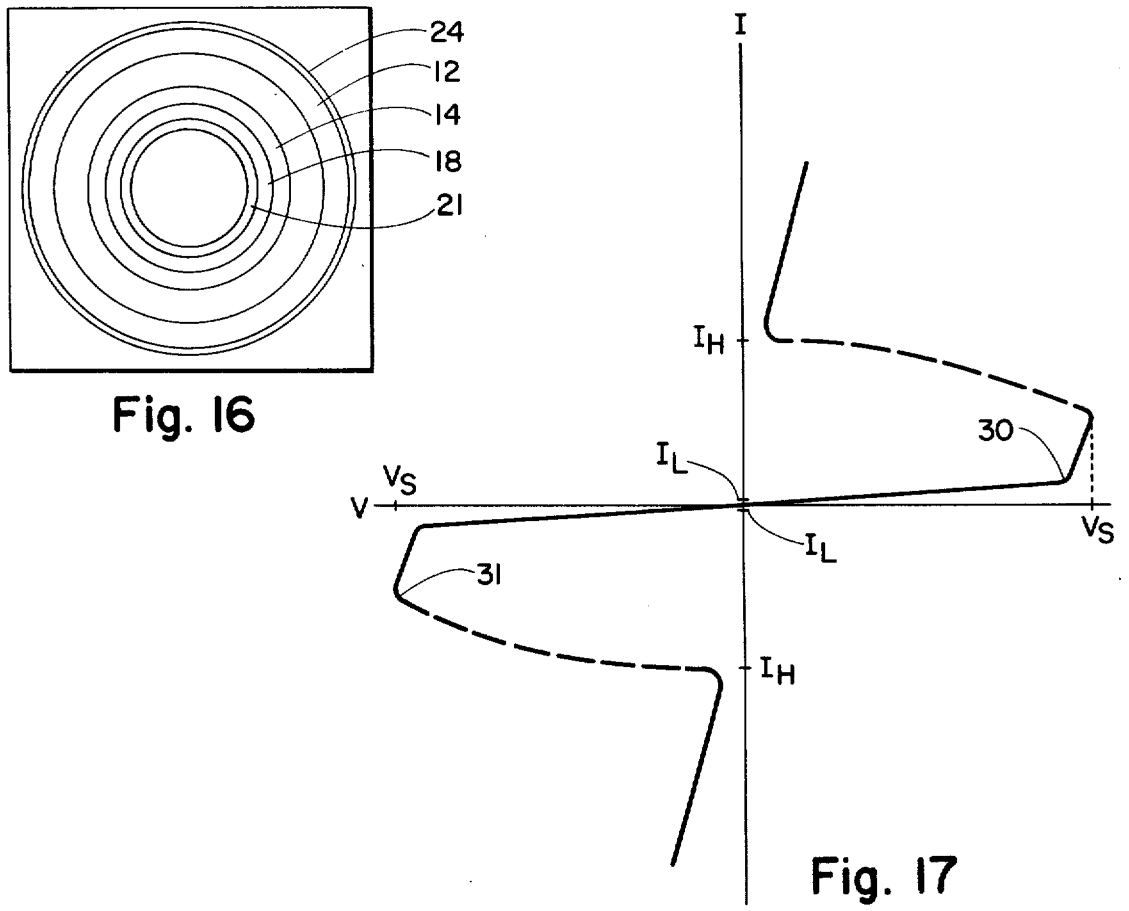
FIG. 16 is a diagrammatic plan view of a device as in FIGS. 1 to 15.
FIG. 17 is a diagrammatic curve illustrating the operating characteristics of a device in accordance with the present invention.

In applying the process, a substrate wafer will have a large number of devices formed thereon. A somewhat diagrammatic plan view of one device is seen in FIG. 16. This is much enlarged, as are also the cross-section of FIGS. 1 to 15, for clarity. Typically up to 250 devices can be formed on a wafer about 2 inches diameter. After cleaning the wafer is scribed and broken into chips each having a device thereon.

A device, in accordance with the invention —manufactured as described above— is bi-lateral, or bi-directional. That is it will provide a switching action for pulses of either polarity. Thus as seen in FIG. 17, the curve 30 illustrates the characteristic for a positive going pulse and curve 31 is representative for a negative going pulse. At low voltages the device acts as a very high resistance device with a low current flow. At a predetermined value however it "switches". On the curves 30 and 31 these positions, or values, are indicated at $V_s$. At these voltage values the device becomes conductive, passing a high current at a comparatively low voltage. The device will continue to act as a low resistance device as long as a current of sufficient value —a holding current— indicated as $I_H$-flows. The values of $V_S$ and $I_H$ are determined by the process. In the particular examples referred to in the above description of the process for masking devices, in conjunction with FIGS. 1 to 16, $V_S$ is of the order of 300V and $I_H$ is of the order of 300m.A minimum. When used as a lightning protector, as described later, certain parameters are set by the installation. Thus, for example, a minimum value is set for $I_H$ which is higher than the value capable of being provided by the normal line voltage for the telephone. The value for $I_H$ must be above this value or the device will not "switch off" once it has been actuated by a lightning pulse. Similarly it is desirable that at the normal operating voltage of the telephone line the current flow through the device in an off state should be minimized. In the present example this current flow, indicated at $I_L$, is less than $1\mu A$ at 50 volts.

Normally the device operates on the lower straight line portion of the curve 30. If there is lightning strike near cables or other equipment which creates a voltage surge then the device operates on curve 30 for a positive pulse or surge or on curve 31 for a negative pulse or surge. If the pulse reaches a value equal to or above $V_S$ —in the present example approximately 300 volts— the device switches to a conducting mode, connecting the telephone line to ground. Once the pulse, or surge, has passed the device returns to a non-conducting mode. The device is capable of such operation many times —hundreds of cycles.

There is also provided, in a modification as described above, and illustrated in FIG. 3, a second stage of protection by oxide breakdown. The oxide breakdown area or zone is indicated at 12 in FIG. 3 —and in subsequent figures. The arrangement is such that a sufficient thickness of the oxide layers 11 is provided at the areas 12 to give a breakdown voltage somewhat higher than $V_S$. In the present example a typical value is 500 volts. Therefore, if for some reason the device does not operate satisfactorily or the voltage builds up in spite of actuation of the device, there will be a breakdown of the oxide layers 11 to give direct conduction to ground.

Figure 21:
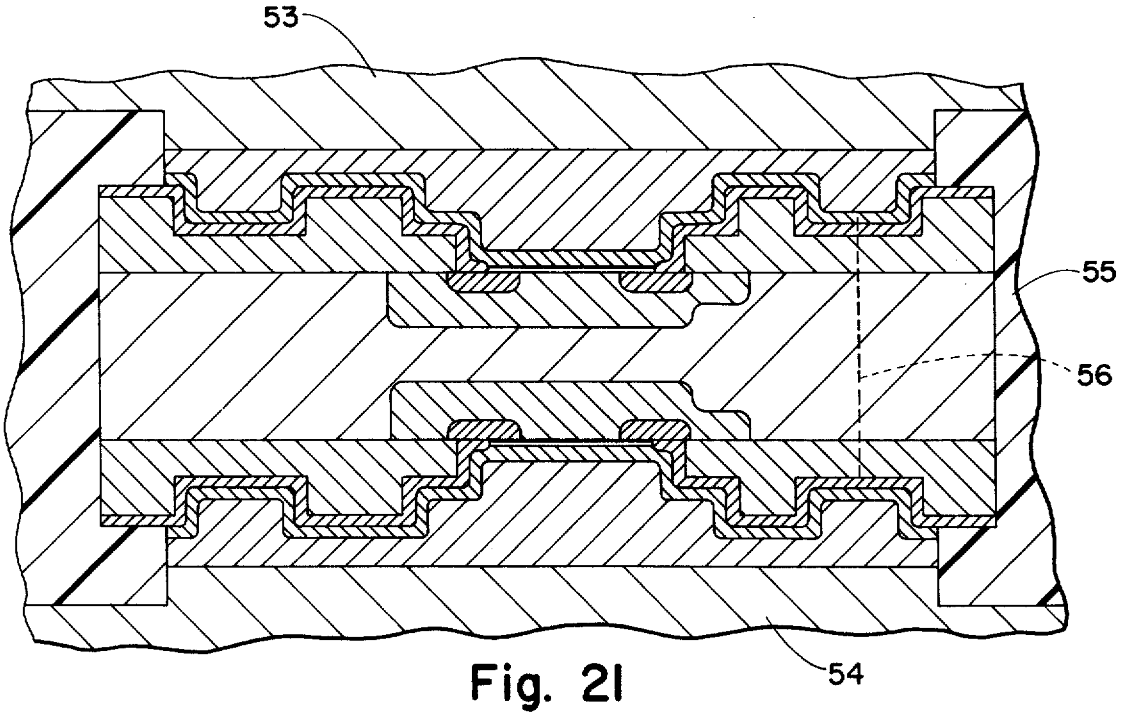
FIG. 21 is an enlarged cross-section of the part of FIG. 20 in the circle X.
Figure 18:
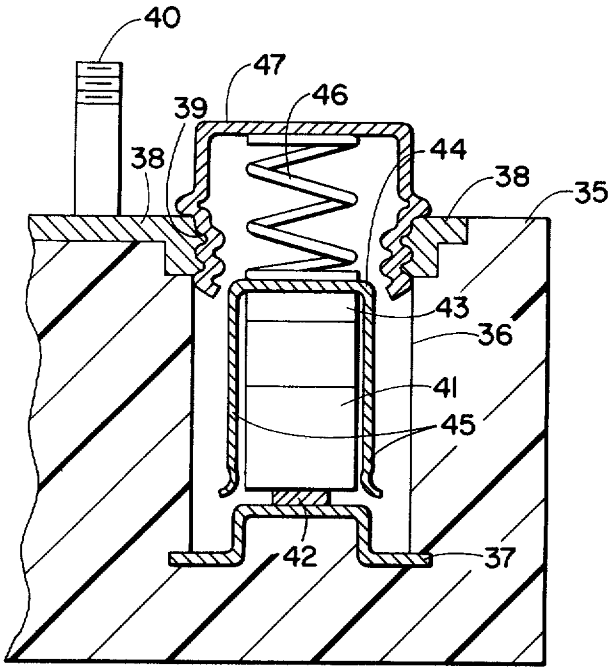
FIG. 18 is a cross-section of a surge protector, as used for protecting communication and other electronic equipment, embodying the present invention.
Figure 19:
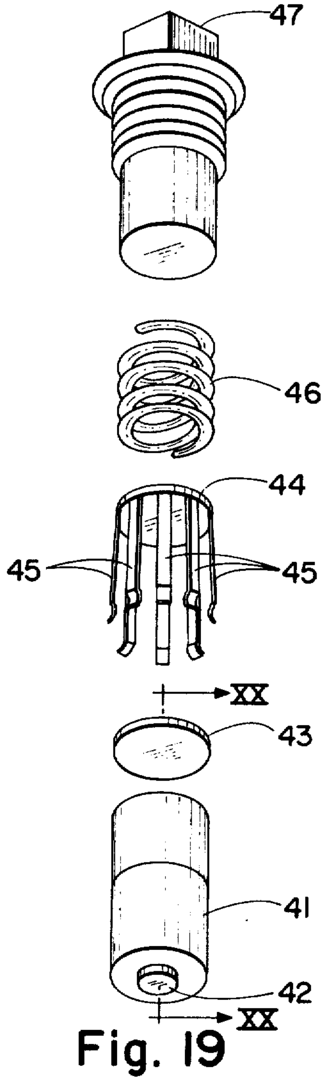
FIG. 19 is an exploded view of the individual parts assembled in the protector illustrated in FIG. 18.
Figure 20:
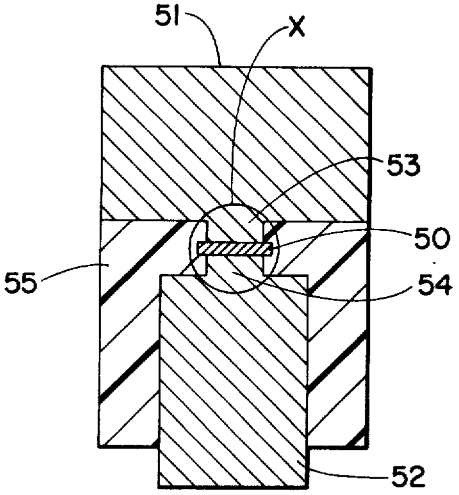
FIG. 20 is a cross-section through the assembly of bi-directional switch and mounting.

FIGS. 19 to 21 illustrate the application of a device as described above as a lightning protector for telephones, and similar uses. As illustrated in FIGS. 18 and 19 a protector comprises a housing 35, of insulating material, having a recess 36. An electrical contact 37 is positioned in the bottom of a recess, the contact 37 being connected to a terminal on the housing 35 (not shown). At the top of the recess is a further electrical contact 38 having a threaded aperture 39, for a purpose to be described, the contact 38 connected to terminal 40.

Positioned in the recess is a member 41 which is an encapsulated device of the form described above in relation to FIGS. 1 to 15. A contact member 42 of the member 41 rests on the electrical contact 37. Resting on top of the member 41 is a fusible metal slug 43 and positioned over, and around, the slug 43 and member 41 is a cage member 44. The cage member 44 has a plurality of legs 45 which are normally out of contact with the electrical contact 37. Acting on the cage member 44 is a compression spring 46, the spring held in position on the cage member, and the whole assembly of spring cage members, slug and member 41 held firmly in position by a metal cap 47 which screws into the before mentioned threaded aperture 39 of the electrical contact 38.

The member 41 is seen in more detail in FIG. 20. The device or chip is indicated at 50 and is positioned between two cylindrical metal members 51 and 52. The members 51 and 52 have small bosses 53 and 54 respectively, the bosses engaging with the metal layers of the device. This is seen in more detail in FIG. 21 where the device 50 is as in FIG. 15 and in between the bosses 53 and 54. The device and the metal members are encapsulated in a synthetic resin, indicated at 55. A short length of the member 52 extends from the encapsulating material to ensure good electrical contact with the contact 37. The encapsulating material does not envelope the top member 51, in the present example and therefore good electrical contact occurs between member 51 and the contact 38 via the slug 43, cage 44, spring 46 and cap 47.

Under normal conditions, the device 50, FIG. 20, in the member 41 FIG. 18, is substantially non-conducting. In the event of a lightning strike causing a high voltage surge in the telephone line, or if a similar surge is caused for any reason, the device becomes "switched on" as described above in connection with FIG. 17. After the surge has passed, the device returns to its normal non-conducting condition. If the surge is of too high a voltage to be handled by the device, or if for any reason the voltage continues to rise, then the device can be caused to breakdown through the oxide layer at the region 12. A typical path of such a breakdown is indicated by dotted line 56 in FIG. 21. This is a permanent breakdown and while the device may return to a normal condition, is likely to require replacement.

If a more continuous high voltage is applied to the telephone wire, or if for some reason the device does not operate correctly, then there will be a rapid rise in temperature of the device and its encapsulating material and the members 51 and 52. At a predetermined rise, the slug 43 will melt. This will permit the cage member 44 to move under the action of the spring 46 and the ends of the legs 45 come into contact with the contact 37. This creates a permanent electrical short and the member 41 and slug 43 will need to be replaced, plus also probably cage member 44.

The member 41 is of such dimensions that it can be used to directly replace the carbon blocks presently used. Normally it is capable of very many cycles of operation, as against the relatively few cycles obtained with carbon blocks.

There is also a further use of the device. It can be used to check the telephone lines to a subscribers residence. Thus, for example, if a complaint is received from a subscriber, it is possible to apply a pulse to one of the pair of lines. The pulse is such as will "trigger" or "switch on" the device, as described above in relation to FIG. 17. If a complete circuit is obtained then the lines are not faulty. This facility of being able to check the telephone lines is of particular use when a subscriber is providing his own telephone or service inside his building, the telephone company only responsible for service to the building. It is possible to detect whether a fault is in the service to the building, or is in the building.

What is claimed is:

1. A process for making a bi-directional solid state device, comprising:

forming an oxide layer on each surface of a substrate wafer of one semiconductor type;

photoengraving simultaneously on both sides of said wafer to define aligned base regions;

simultaneously diffusing base regions to have a semiconductor type opposed to said substrate;

photoengraving simultaneously on both sides of said wafer to define aligned emitter regions in said base regions;

simultaneously diffusing emitter regions to have a semiconductor type the same as said substrate;

forming electrical contacts to said base and emitter regions.

2. A process as in claim 1, including, after forming said oxide layer simultaneously photoengraving and reoxidizing to form aligned regions of reduced oxide thickness.

3. A process as claimed in claim 1, including, simultaneously forming a passivation layer on each side of the wafer after diffusing the emitter regions and before forming said electrical contacts; and photoengraving simultaneously on both sides of the wafer to open contact regions through passivation layers.

* * * * *